US012802931B2

(12) United States Patent
Ozawa et al.

(10) Patent No.: US 12,802,931 B2
(45) Date of Patent: Nov. 17, 2026

(54) PLASMA PROCESSING APPARATUS AND COIL HOLDER FOR HOLDING PLASMA EXCITATION ANTENNA

(71) Applicant: Tokyo Electron Limited, Tokyo (JP)

(72) Inventors: Masato Ozawa, Nirasaki City (JP); Chanseong Ahn, Nirasaki City (JP); Masaki Tsunoda, Nirasaki City (JP)

(73) Assignee: Tokyo Electron Limited, Tokyo (JP)

(*) Notice: Subject to any disclaimer, the term of this patent is extended or adjusted under 35 U.S.C. 154(b) by 527 days.

(21) Appl. No.: 18/475,502

(22) Filed: Sep. 27, 2023

(65) Prior Publication Data

US 2024/0105422 A1 Mar. 28, 2024

(30) Foreign Application Priority Data

Sep. 27, 2022 (JP) ................................ 2022-154055

(51) Int. Cl.
*H01J 37/32* (2006.01)

(52) U.S. Cl.
CPC ......... *H01J 37/3211* (2013.01); *H01J 37/321* (2013.01)

(58) Field of Classification Search
CPC ........... H01J 37/32082; H01J 37/32091; H01J 37/321; H01J 37/3211
See application file for complete search history.

(56) References Cited

U.S. PATENT DOCUMENTS 6,192,829 B1 * 2/2001 Karazim ............... H01J 37/321 118/724
11,177,067 B2 * 11/2021 Mopidevi ............... H01F 27/36
2003/0067273 A1 * 4/2003 Benjamin ............. H01J 37/321 315/111.21
2006/0121210 A1 * 6/2006 Kim ...................... B08B 7/0035 134/1.1
2010/0269980 A1 * 10/2010 Nishimura ............... H05H 1/46 156/345.48
2011/0094995 A1 * 4/2011 Yamazawa ............ H01J 37/321 216/68

(Continued)

FOREIGN PATENT DOCUMENTS

JP 2007214262 A * 8/2007
JP 2017-085161 A 5/2017

*Primary Examiner* — Aiden Lee
(74) *Attorney, Agent, or Firm* — Armstrong Teasdale LLP

(57) ABSTRACT

A plasma processing apparatus includes: a processing container; a stage arranged inside the processing container to place a substrate to be processed on the stage; a plasma excitation antenna arranged above the processing container; a coil holder for holding the plasma excitation antenna; and a radio-frequency power supply for supplying radio-frequency power to the plasma excitation antenna. The coil holder includes a plurality of beam-like members arranged radially to protrude outward from a center of the coil holder, and a clamp-like member attached to each of the plurality of beam-like members and suspended downward from each of the plurality of beam-like members. The clamp-like member has an upper end supported by each beam-like member with a screw member and is configured to move in a pendulum manner, and a gripper configured to grip and hold the plasma excitation antenna is formed in a lower end of the clamp-like member.

12 Claims, 7 Drawing Sheets

(56) References Cited

U.S. PATENT DOCUMENTS

| | | | | |
|---|---|---|---|---|
| 2014/0367045 | A1* | 12/2014 | Long | H01J 37/3211 156/345.35 |
| 2014/0367046 | A1* | 12/2014 | Todorow | H01J 37/32532 315/111.21 |

* cited by examiner

PLASMA PROCESSING APPARATUS AND COIL HOLDER FOR HOLDING PLASMA EXCITATION ANTENNA

CROSS-REFERENCE TO RELATED APPLICATION

This application is based upon and claims the benefit of priority from Japanese Patent Application No. 2022-154055, filed on Sep. 27, 2022, the entire contents of which are incorporated herein by reference.

TECHNICAL FIELD

The present disclosure relates to a plasma processing apparatus and a coil holder for holding a plasma excitation antenna.

BACKGROUND

Patent Document 1 discloses a substrate processing apparatus capable of properly removing reaction products generated when an etching target film is etched. The apparatus disclosed in Patent Document 1 includes a radio-frequency antenna. The radio-frequency antenna includes an inner antenna element and an outer antenna element which are formed in a spiral coil shape.

PRIOR ART DOCUMENT

Patent Document

Patent Document 1: Japanese Laid-Open Patent Publication No. 2017-085161

SUMMARY

According to one embodiment of the present disclosure, there is provided a plasma processing apparatus including: a processing container; a stage arranged inside the processing container and configured to place a substrate to be processed on the stage; a plasma excitation antenna arranged above the processing container; a coil holder configured to hold the plasma excitation antenna; and a radio-frequency power supply configured to supply radio-frequency power to the plasma excitation antenna. The coil holder includes a plurality of beam-like members arranged radially to protrude outward from a center of the coil holder, and a clamp-like member attached to each of the plurality of beam-like members and suspended downward from each of the plurality of beam-like members. The clamp-like member has an upper end supported by each of the plurality of beam-like members with a screw member and is configured to move in a pendulum manner, and a gripper configured to grip and hold the plasma excitation antenna is formed in a lower end of the clamp-like member.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
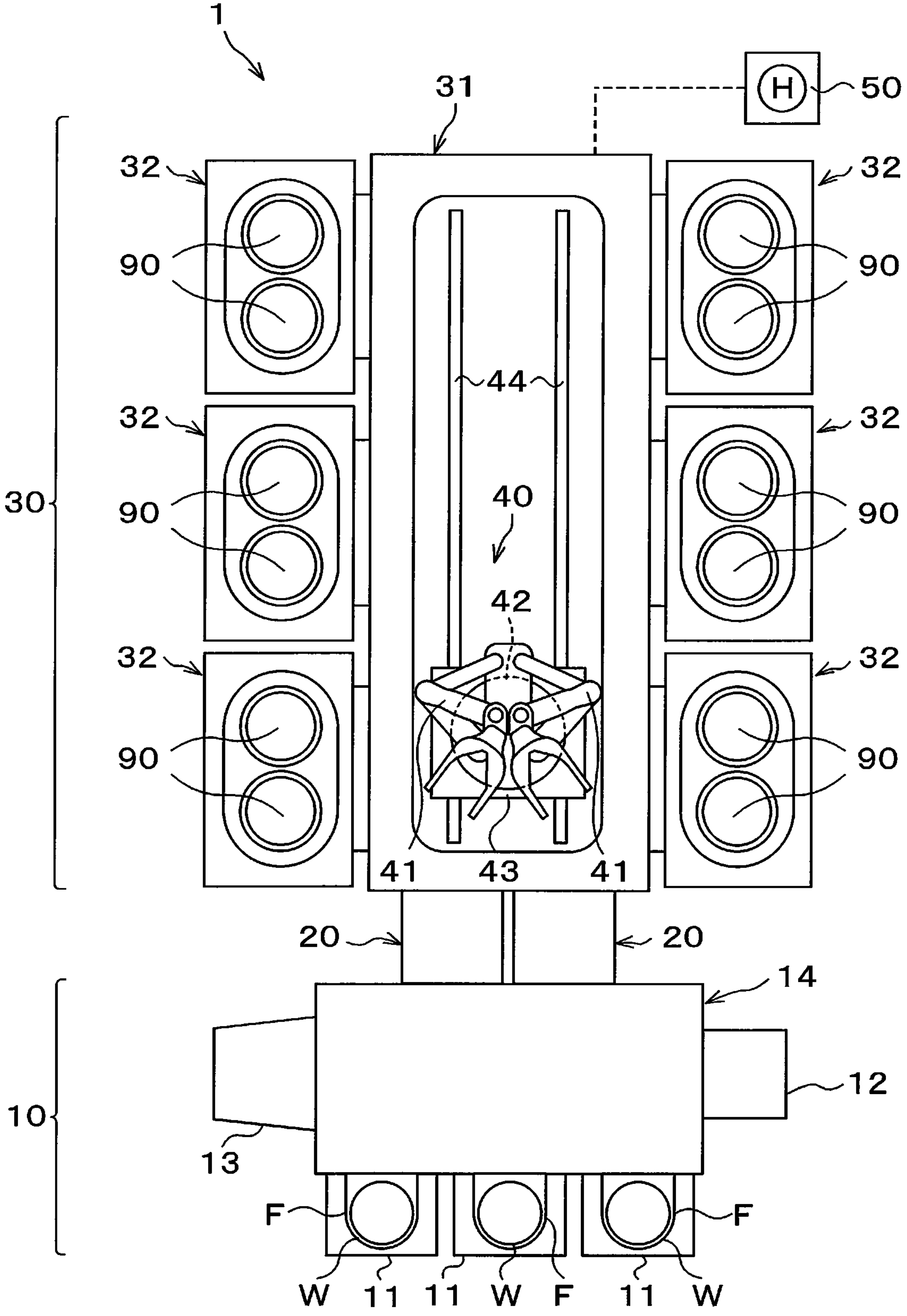
FIG. 1 is a plan view illustrating an example of a configuration of a vacuum processing system.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In the manufacturing process of semiconductor devices and the like, a plasma processing such as etching is performed on a semiconductor substrate (hereinafter simply referred to as "substrate") using a plasma. As an example, in such a plasma processing, a radio-frequency (RF) signal is supplied to coil-like antenna elements arranged above a processing container in which a substrate to be processed is accommodated, so that inductively-coupled plasma (ICP) is generated inside the processing container.

An apparatus that performs such a plasma processing includes coil-like antenna elements constituting an RF circuit and a coil holder for holding the antenna elements. For example, Patent Document 1 discloses an example in which a plurality of grippers (i.e., coil holder) grips and integrates an inner antenna element and an outer antenna element which constitute a radio-frequency antenna.

However, in the coil-like antenna elements, an excessive force may be applied to the coil holder due to, for example, deformation caused by thermal expansion and contraction in a diameter direction. In that case, friction may occur between the antenna elements and the coil holder, which may generate dust caused by a coating material or the like on the antenna elements. The generated dust may cause an abnormal discharge due to discharge from the antenna elements. For example, such an abnormal discharge may cause the burnout of components, the stoppage of the apparatus or the like. Patent Document 1 described above fails to disclose or teach the generation of the dust due to the thermal expansion and contraction of the antenna elements and the occurrence of the abnormal discharge resulting from the dust.

The technique of the present disclosure has been made considering the above circumstances and suppresses the occurrence of an abnormal discharge in an RF circuit during a plasma processing in a suitable manner. In the following, a plasma processing apparatus and a coil holder included in the plasma processing apparatus according to the present embodiment will be described with reference to the drawings. In addition, in this specification and the accompanying drawings, elements having substantially the same functional configuration will be denoted by the same reference numerals, and redundant descriptions thereof will be omitted.

<Vacuum Processing System>

First, a configuration of the vacuum processing system according to one embodiment will be described.

As illustrated in FIG. 1, the vacuum processing system 1 has a configuration in which an atmospheric-side section 10 and a depressurization-side section 30 are integrally connected to each other via a load lock module 20.

The atmospheric-side section 10 includes load ports 11 on each of which a FOUP "F" capable of storing a plurality of substrates W is placed, a cooling storage 12 for cooling the substrates W processed in the depressurization-side section 30, an aligner module 13 for adjusting a horizontal orientation of the substrates W, and a loader module 14 for transferring the substrates W inside the atmospheric-side section 10.

The loader module 14 has a rectangular housing whose interior is in an atmospheric pressure atmosphere. A plurality of (for example, three) load ports 11 is arranged side by side on one side of the housing, which forms the long side of the loader module 14. A plurality of (for example, two) load lock modules 20 is arranged side by side on the other side of the housing, which forms the long side of the loader module 14. The cooling storage 12 is provided on one side of the housing, which forms the short side of the loader module 14. The aligner module 13 is provided on the other side of the housing, which forms the short side of the loader module 14.

Further, a wafer transfer mechanism (not illustrated) for transferring the substrates W is provided inside the loader module 14. The wafer transfer mechanism includes a transfer arm (not illustrated) that holds and moves the substrates W and is configured to transfer the substrates W to each of the FOUP "F" placed on each load port 11, the cooling storage 12, the aligner module 13, and the load lock modules 20.

Each of the load lock modules 20 temporarily holds the substrates W transferred from the loader module 14 (to be described later) of the atmospheric-side section 10 to deliver the substrates W to a transfer module 31 (to be described later) of the depressurization-side section 30. The load lock module 20 includes a plurality of (for example, two) stockers (not illustrated) provided therein to simultaneously hold two substrates W. Further, each of the load lock modules 20 includes a gate valve (not illustrated) for ensuring airtightness with respect to each of the loader module 14 and the transfer module 31 (to be described later). Through the gate valve, the airtightness between the load lock module 20 and the transfer module 31 is ensured and the loader module 14 and the transfer module 31 are in communication with each other. Further, each of the load lock modules 20 is connected to a gas inlet (not illustrated) and a gas outlet (not illustrated) such that the interior of each load lock module 20 is switched between an atmospheric pressure atmosphere and a depressurized atmosphere. That is, the load lock module 20 is configured to properly transfer the substrates W between the atmospheric-side section 10 kept in the atmospheric pressure atmosphere and the depressurization-side section 30 kept in the depressurized atmosphere.

The depressurization-side section 30 includes the transfer module 31 for simultaneously transferring two substrates W, and a plasma processing apparatus 32 for performing a desired plasma processing on the substrates W loaded from the transfer module 31. The interiors of the transfer module 31 and the plasma processing apparatus 32 are kept in the depressurized atmosphere, respectively. Further, a plurality of (for example, six) plasma processing apparatuses 32 are provided for the transfer module 31.

The transfer module 31 has a housing whose interior is rectangular and is connected to each of the load lock modules 20 via the above-described gate valves. The transfer module 31 transfers the substrates W loaded into the load lock module 20 to one plasma processing apparatus 32 where the plasma processing is performed on the substrates W, and subsequently, unloads the substrates W to the atmospheric-side section 10 via the load lock module 20.

A wafer transfer mechanism 40 for transferring the substrates W is provided inside the transfer module 31. The wafer transfer mechanism 40 includes transfer arms 41 and 41 which hold and move two substrates W side by side in a vertical arrangement, a rotatable table 42 which rotatably supports the transfer arms 41 and 41, and a rotatable stage 43 on which the rotatable table 42 is mounted. Further, a guide rail 44 extending in a longitudinal direction of the transfer module 31 is provided inside the transfer module 31. The rotatable stage 43 is provided on the guide rail 44 to move the wafer transfer mechanism 40 along the guide rail 44.

Each plasma processing apparatus 32 includes a gate valve 32*a* (see FIG. 2) for ensuring airtightness with respect to the transfer module 31. Through the gate valve 32*a*, the airtightness between the transfer module 31 and the plasma processing apparatus 32 is ensured and the transfer module 31 and the plasma processing apparatus 32 are in communication with each other.

Further, the plasma processing apparatus 32 is provided with two stages 90 and 90 on which two substrates W are placed step by step in a horizontal direction. The plasma processing apparatus 32 performs a certain plasma processing on the two substrates W in a simultaneous manner by placing the two substrates W step by step on the two stages 90 and 90. In addition, a detailed configuration of the plasma processing apparatus 32 will be described later.

The vacuum processing system 1 described above is provided with a control device 50. The control device 50 is, for example, a computer including a CPU, a memory, or the like, and includes a program storage (not illustrated). A program that controls the processing of the substrates W in the vacuum processing system 1 is stored in the program storage. Further, the program storage also stores programs for controlling the operation of a drive system such as various processing modules and transfer mechanisms described above and controlling a wafer transfer timing in the vacuum processing system 1, which will be described later. In addition, the programs may be recorded on a computer-readable storage medium H and may be installed in the control device 50 from the storage medium H. In addition, the above-described storage medium H may be a transitory storage medium or a non-transitory storage medium.

<Plasma Processing Apparatus>

Figure 2:
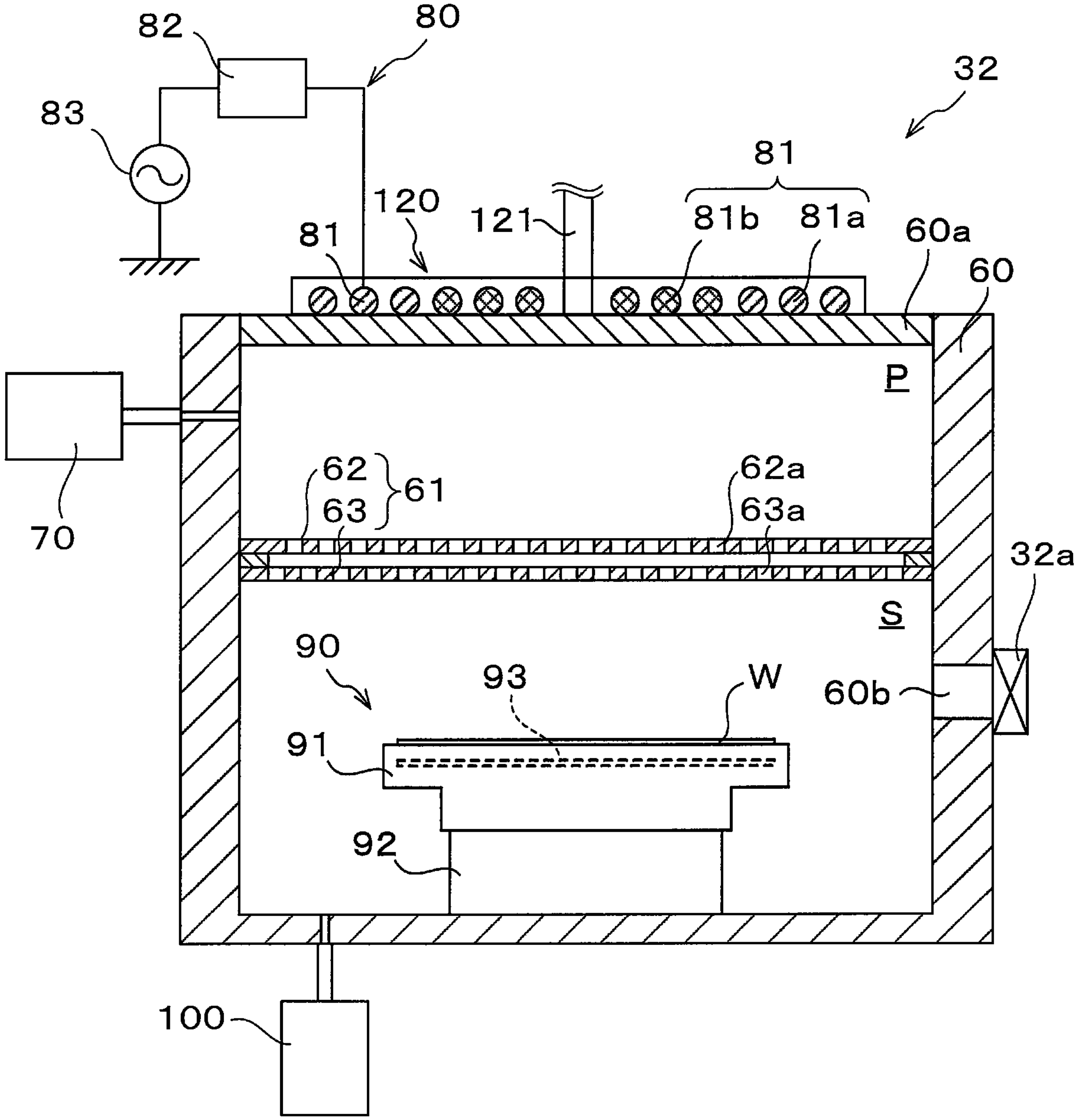
FIG. 2 is a vertical cross-sectional view illustrating an example of a configuration of a plasma processing apparatus according to the present embodiment.

Next, details of a configuration of the above-described plasma processing apparatus 32 will be described. FIG. 2 is a vertical cross-sectional view illustrating a schematic configuration of the plasma processing apparatus 32. In addition, as illustrated in FIG. 1, the two stages 90 and 90 are arranged step by step in the horizontal direction inside the plasma processing apparatus 32. However, for the sake of avoiding complexity of illustration, one stage 90 is illustrated in FIG. 2. In other words, FIG. 2 illustrates a vertical cross-sectional view as viewed from one side which forms the short side of the plasma processing apparatus 32.

As illustrated in FIG. 2, the plasma processing apparatus 32 includes a processing container 60 which has a hermetically sealed structure and accommodates the substrates W therein. The processing container 60 is made of, for example, aluminum or an aluminum alloy, and has an opened upper end. The upper end of the processing container 60 is closed by a lid 60*a* constituting a ceiling portion. A loading/unloading port 60*b* for the substrate W is provided in a side surface of the processing container 60. The loading/unloading port 60*b* is configured to be opened and closed by the aforementioned gate valve 32*a*.

The interior of the processing container 60 is divided into an upper plasma generation space P and a lower processing space S by a partition plate 61. The plasma generation space P is a space in which plasma is generated, and the processing space S is a space in which the substrate W is subjected to the plasma processing.

The partition plate 61 includes at least two plate members 62 and 63 which are arranged to overlap each other with a gap from the plasma generation space P toward the processing space S. The plate members 62 and 63 have slits 62*a* and 63*a* formed to penetrate the plate members 62 and 63 in the overlapping direction, respectively. Further, the slits 62*a* and 63*a* are arranged so as not to overlap each other in a plan view. Thus, the partition plate 61 functions as a so-called ion trap that prevents ions in the plasma from transmitting through the processing space S when the plasma is generated in the plasma generation space P. More specifically, a labyrinth structure in which the slits 62*a* and 63*a* are arranged so as not to overlap each other prevents the movement of anisotropically-moving ions while allowing isotropically-moving radicals to permeate therethrough.

The plasma generation space P includes a gas supplier 70 which supplies a processing gas into the processing container 60 and a plasma generator 80 which plasmarizes the processing gas supplied into the processing container 60.

The gas supplier 70 is connected to a plurality of gas sources (not illustrated), and supplies a desired processing gas depending on the purpose of a plasma processing on the substrate W into the processing container 60. The processing gas supplied into the processing container 60 may be, for example, a mixed gas containing an oxygen-containing gas such as an $O_2$ gas, or a diluent gas such as an Ar gas.

Further, the gas supplier 70 is provided with a flow rate adjuster (not illustrated) which regulates an amount of the processing gas supplied into the plasma generation space P. The flow rate adjuster includes, for example, an on-off valve and a mass flow controller.

The plasma generator 80 is configured as an inductively-coupled device using an RF antenna. The lid 60*a* of the processing container 60 is made of, for example, a quartz plate, and is configured as a dielectric window. An RF antenna 81 is formed above the lid 60*a* to generate an inductively-coupled plasma in the plasma generation space P of the processing container 60. The RF antenna 81 is connected to a radio-frequency power supply 83 via a matcher 82 including a matching circuit for the matching of impedances at a power-supply side and a load side. The radio-frequency power supply 83 outputs the radio-frequency power having a certain frequency suitable for plasma generation (usually 13.56 MHz or more) at a certain output value. In addition, two RF antennas 81 are provided so as to respectively correspond to the two stages 90 (to be described later) which are arranged inside the processing space S.

As illustrated in FIG. 2, the RF antenna 81 is an antenna for inductively-coupled plasma excitation and is an antenna assembly composed of a main-coil 81*a* and a sub-coil 81*b*. The sub-coil 81*b* is provided radially inward of the main-coil 81*a*. The main-coil 81*a* is arranged to surround the sub-coil 81*b*. An outer shape of each of the main-coil 81*a* and the sub-coil 81*b* is formed in a substantially circular spiral shape in a plan view. Both ends of each coil are open. Further, the main-coil 81*a* and the sub-coil 81*b* are arranged such that the outer shapes thereof are in a concentric relationship with each other. The main-coil 81*a* and the sub-coil 81*b* are made of, for example, a conductor such as copper, aluminum, stainless steel or the like.

The main-coil 81*a* and the sub-coil 81*b* are held to be integrated with each other while being gripped by a coil holder 120 serving as a gripper. The coil holder 120 is supported by a supporter 121 in the vicinity of the center of the coil holder 120 and is radially arranged to protrude outward from the supporter 121. A detailed configuration of the coil holder 120 will be described later. In one embodiment, the coil holder 120 includes a beam-like member 122 having a rod shape and a clamp-like member 125 attached to the beam-like member 122 (as shown in, for example, FIG. 3). Further, in one embodiment, a gap may be defined in a height direction between the coil holder 120 which grips the main-coil 81*a* and the sub-coil 81*b*, and the lid 60*a*. This gap may be designed to be, for example, at least 2 mm or more. The presence of the gap suppresses components from being damaged due to thermal expansion and contraction of the main-coil 81*a* or the sub-coil 81*b*. In addition, the coil holder 120 may be made of any material as long as it is an insulator having high heat resistance. For example, the coil holder 120 is made of polyimide.

The two stages 90 and 90 (as described above, only one of which is illustrated in FIG. 2), on each of which one substrate W is placed in a horizontal posture, are arranged inside the processing space S. The stage 90 has a substantially cylindrical shape and includes an upper stand 91 on which the substrate W is placed and a lower stand 92 which supports the upper stand 91. A temperature adjusting mechanism 93 is provided inside the upper stand 91 to adjust a temperature of the substrate W.

An exhauster 100 is provided at the bottom of the processing container 60. The exhauster 100 is connected to an exhaust mechanism (not illustrated) such as, for example, a vacuum pump, via an exhaust pipe connected to the processing space S. Further, the exhaust pipe is provided with an automatic pressure control valve (APC). An internal pressure of the processing container 60 is controlled by the exhaust mechanism and the automatic pressure control valve.

In addition, the operation of the plasma processing apparatus 32 described above may be controlled by the aforementioned control device 50. In other words, the aforementioned control device 50 may store a program for controlling the processing of the substrate W in the plasma processing apparatus 32. However, a control device that controls the operation of the plasma processing apparatus 32 is not necessarily the control device 50 provided outside the plasma processing apparatus 32. For example, the operation of the plasma processing apparatus 32 may be controlled using a controller (not illustrated) provided independently of the plasma processing apparatus 32.

<Coil Holder>

Figure 3:
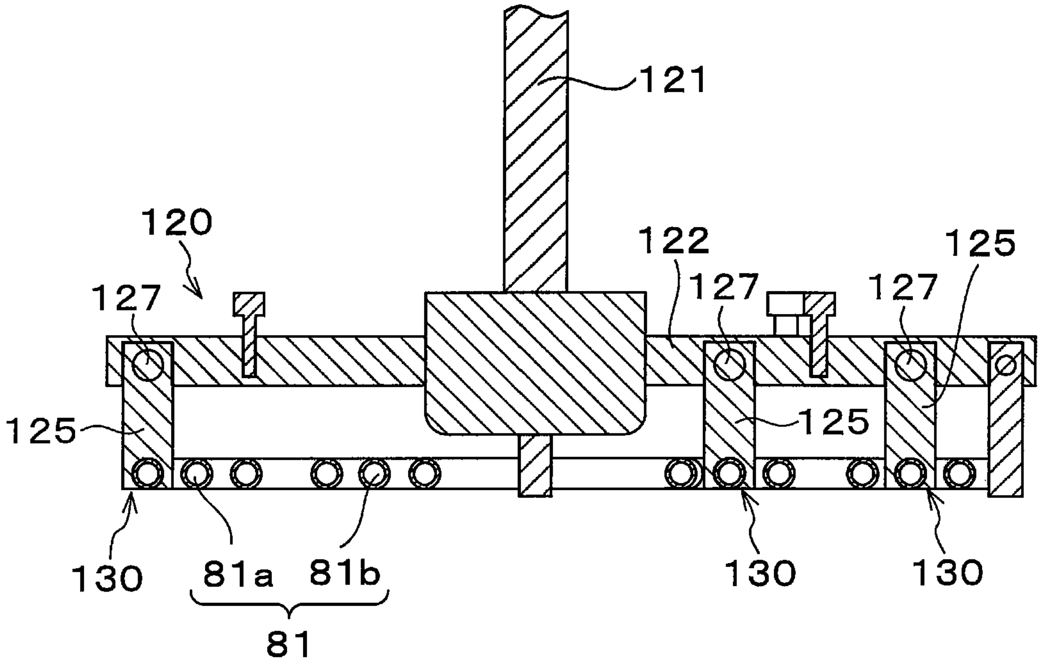
FIG. 3 is a schematic side view of a coil holder.
Figure 4:
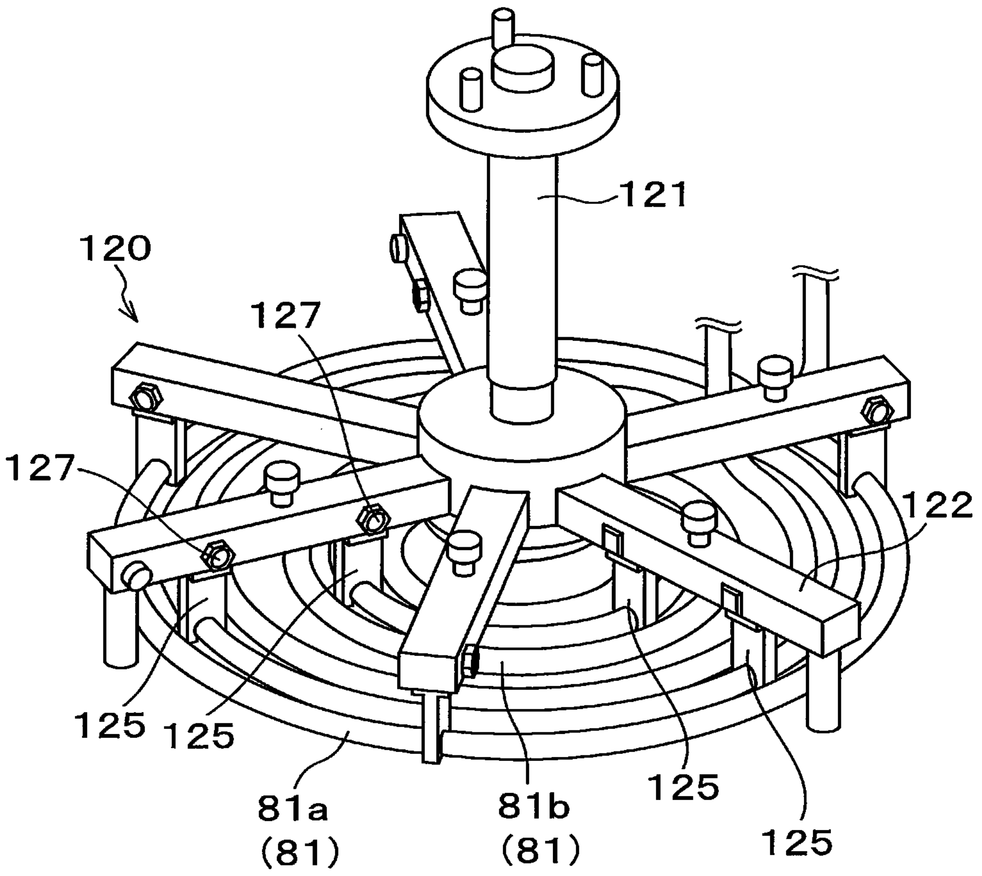
FIG. 4 is a schematic plane view of the coil holder.
Figure 5:
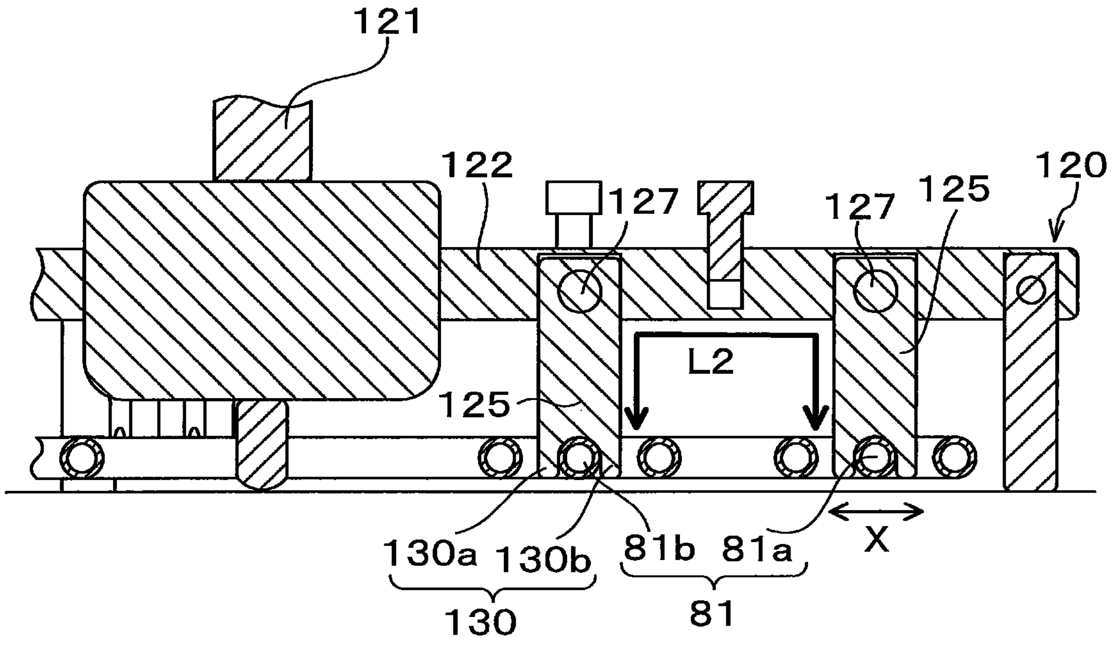
FIG. 5 is a partially enlarged view of the coil holder.

Next, details of a configuration of the coil holder 120 according to the present embodiment will be described. FIG. 3 is a schematic side view of the coil holder 120, and FIG. 4 is a schematic plane view of the coil holder 120. FIG. 5 is a partially enlarged view of the coil holder 120. In addition, for the sake of convenience in description, FIGS. 3 to 5 also illustrate the RF antenna 81 (the main-coil 81*a* and the sub-coil 81*b*) which is an object to be gripped.

As illustrated in FIG. 3, the coil holder 120 is supported by the supporter 121 in the vicinity of the center of the coil holder 120. As illustrated in FIG. 4, the coil holder 120 includes a plurality of beam-like members 122 which has a rod shape and is arranged radially to protrude outward from the center thereof, and the clamp-like member 125 attached to each beam-like member 122. In one embodiment, the clamp-like member 125 is suspended downward from the beam-like member 122. At least one clamp-like member 125 is attached to one beam-like member 122. The number and positions of clamp-like members 125 attached to each of the plurality of beam-like members 122 are optional.

In one embodiment, the clamp-like member 125 is configured such that an upper end thereof is supported to the beam-like member 122 in a pendulum manner (so-called pendulum structure) by a screw member 127. Since the clamp-like member 125 is supported by the screw member 127, the clamp-like member 125 is configured to move in the longitudinal direction of the beam-like member 122 (i.e., in a diametrical direction in the radial arrangement or an X direction in the drawing) with the screw member 127 as an axis.

In one embodiment, a gripper 130 is formed in a lower end of the clamp-like member 125 to grip and hold the main-coil 81*a* or the sub-coil 81*b*. As illustrated in FIG. 5, the gripper 130 includes a pair of gripping members 130*a* and 130*b* provided at left and right sides. The gripper 130 holds a conductor constituting the main-coil 81*a* and the sub-coil 81*b* by sandwiching the conductor between the gripping members 130*a* and 130*b* at both the left and right sides. In addition, the gripper 130 holds the main-coil 81*a* or the sub-coil 81*b* in the left-right direction, and is not configured to support the entire coil. That is, the gripper 130 has a partially open portion in a lower portion thereof, and is not configured to completely hold the entire periphery of the main-coil 81*a* or the sub-coil 81*b*.

Figure 6:
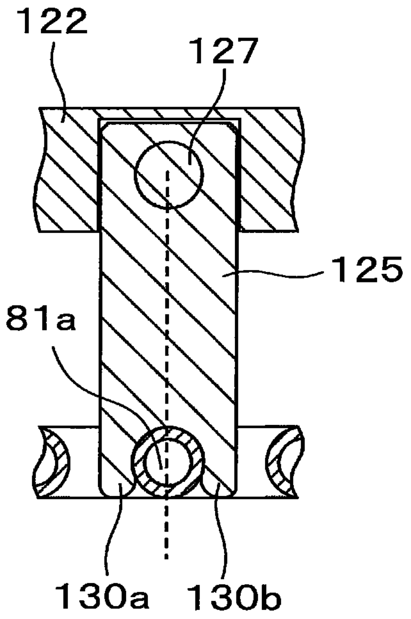
FIG. 6 is a schematic explanatory view illustrating an operation state of a clamp-like member (during a normal operation).
Figure 7:
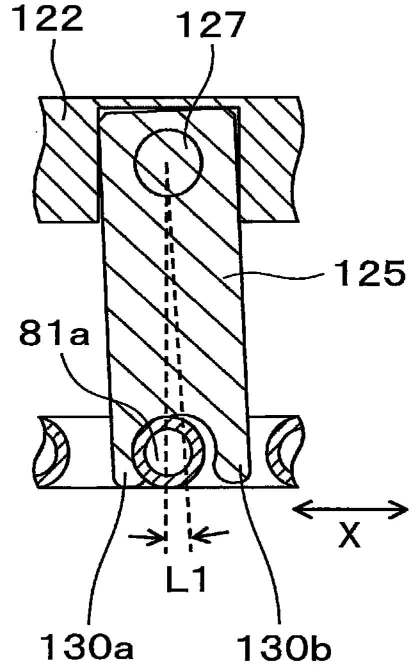
FIG. 7 is a schematic explanatory view illustrating an operation state of the clamp-like member (during a radial expansion).

FIGS. 6 and 7 are schematic explanatory views illustrating an operation state of the clamp-like member 125. FIG. 6 illustrates a state during a normal operation, and FIG. 7 illustrates a state where the RF antenna 81 expands in the diameter direction. Here, the clamp-like member 125 that grips the main-coil 81*a* of the RF antenna 81 is illustrated by way of example.

As illustrated in FIG. 6, during the normal operation, the clamp-like member 125 is supported to the beam-like member 122 by the screw member 127 to extend vertically downward from the beam-like member 122. Further, the main-coil 81*a* is held at the lower end of the clamp-like member 125 by the gripper 130 composed of the gripping members 130*a* and 130*b* at the left and right sides.

On the other hand, for example, during the operation of the plasma processing apparatus 32, a high voltage is applied to the main-coil 81*a* or the sub-coil 81*b*, causing thermal expansion and contraction of the main-coil 81*a* or the sub-coil 81*b*. Therefore, as illustrated in FIG. 7, for example, the main-coil 81*a* expands in the diameter direction (the X direction in the drawing), leading to coil elongation in the diameter direction. Therefore, in one embodiment, the gripper 130 of the clamp-like member 125 is configured to be movable by a distance L1 at a maximum in the diameter direction of the coil (the X direction in the drawing). The distance L1 may be set larger than the maximum value of the coil elongation of the main-coil 81*a* in the diameter direction.

In one embodiment, the distance L1 may be set to, for example, ±1 mm to 1.5 mm in the diameter direction. Alternatively, the distance L1 may be set based on an angle of ±2 degrees to 3 degrees when the screw member 127 is used as an axis in the diameter direction.

As an example, when there is the coil elongation in the diameter direction, the clamp-like member 125 moves in the diameter direction. In this case, when a difference between an extension amount (the coil elongation) of the main-coil 81*a* and an operation amount of the clamp-like member 125 (so-called holder extension) is 1 mm or less, it is allowable. Thus, there is no repulsion of the main-coil 81*a* with respect to the clamp-like member 125. In other words, even if the main-coil 81*a* undergoes the thermal expansion and contraction, no force is applied to the coil holder 120, which makes it difficult to rub the main-coil 81*a* and the coil holder 120 against each other.

<Creeping Distance and Creeping Discharge>

One of the causes of abnormal discharge due to discharge from the RF antenna 81 may be a creeping discharge. Here, the "creeping discharge" means a phenomenon that, when a high voltage is applied to a conductor placed on an insulator, discharge occurs along a surface of the insulator. In the coil holder 120 according to the present embodiment, when a high voltage is applied to the main-coil 81*a* and the sub-coil 81*b*, the creeping discharge may occur between the plurality of clamp-like members 125 which hold the main-coil 81*a* and the sub-coil 81*b*.

In order to suppress the abnormal discharge due to the creeping discharge, in the coil holder 120 according to the present embodiment, the number and positions of clamp-like members 125 attached to the beam-like member 122 need to be optimized to suppress the creeping discharge. In order to suppress the creeping discharge, it is necessary to extend the creeping distance to realize an optimal design. Here, the "creeping distance" refers to the shortest distance along the surface of the insulator between a plurality of conductors which need to be insulated from each other and to which a high voltage is applied. For example, in the configuration illustrated in FIG. 5, the creeping distance refers to the shortest distance (distance L2 in the drawing) along the surface of the coil holder 120 used as an insulator between one clamp-like member 125 holding the main-coil 81*a* and the other clamp-like member 125 holding the sub-coil 81*b*.

As described above, it is necessary to ensure that the coil holder 120 reliably holds the RF antenna 81 (the main-coil 81*a* and the sub-coil 81*b*) and such a holding position is maintained while extending the creeping distance between the clamp-like members 125. Therefore, the present inventors conducted a study on the arrangement and number of clamp-like members 125 in the coil holder 120.

Figure 8:
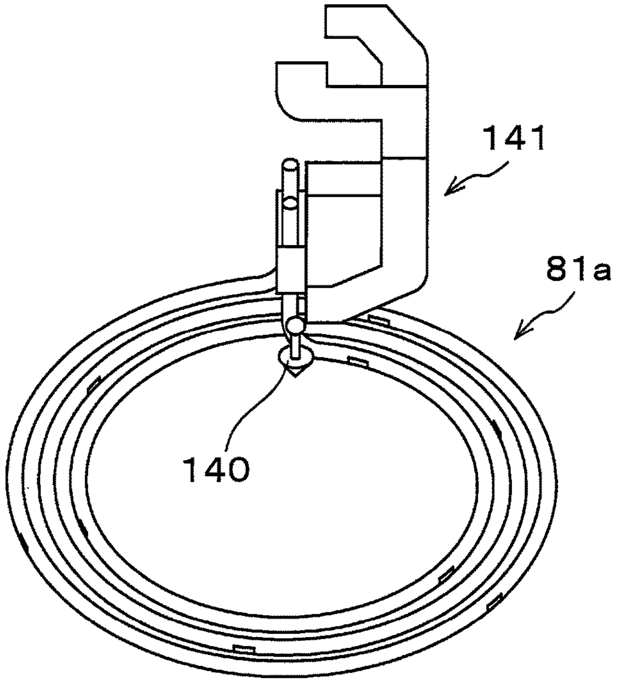
FIG. 8 is a schematic plane view of a main-coil.
Figure 9:
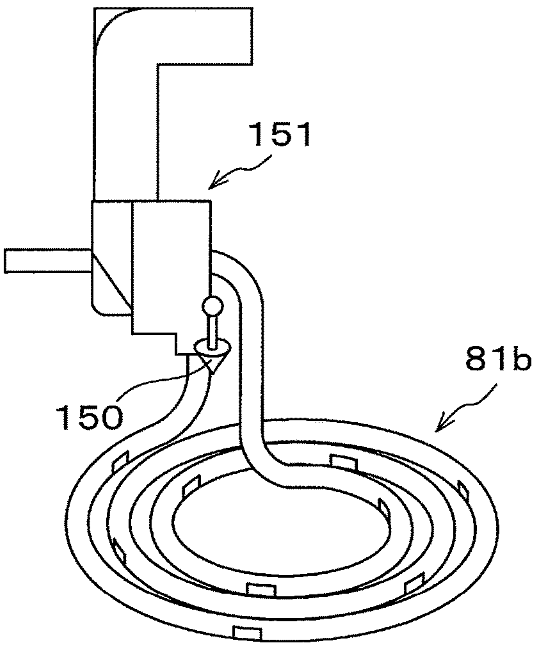
FIG. 9 is a schematic plane view of a sub-coil.

FIG. 8 is a schematic plane view of the main-coil 81*a*, and FIG. 9 is a schematic plane view of the sub-coil 81*b*. As illustrated in FIG. 8, the main-coil 81*a* is configured to be suspended from a supporter 141 by using, as a fulcrum, a wire fixing part 140 which is a starting point of a wire structure. Further, as illustrated in FIG. 9, the sub-coil 81*b* is configured to be suspended from a supporter 151 by using, as a fulcrum, a wire fixing part 150 which is a starting point of a wire structure.

Since each of the main-coil 81a and the sub-coil 81b configured as illustrated in FIGS. 8 and 9 is suspended by its own weight, they are held by the coil holder 120 as described in the present embodiment. In the RF antenna 81 composed of the main-coil 81a and the sub-coil 81b, the present inventors devised the following configuration in order to set the number of clamp-like members 125 as small as possible, extend the creeping distance, and reduce a suspension amount of the RF antenna 81 suspended by its own weight.

<Example of Arrangement Configuration of Clamp-Like Members>

Figure 10:
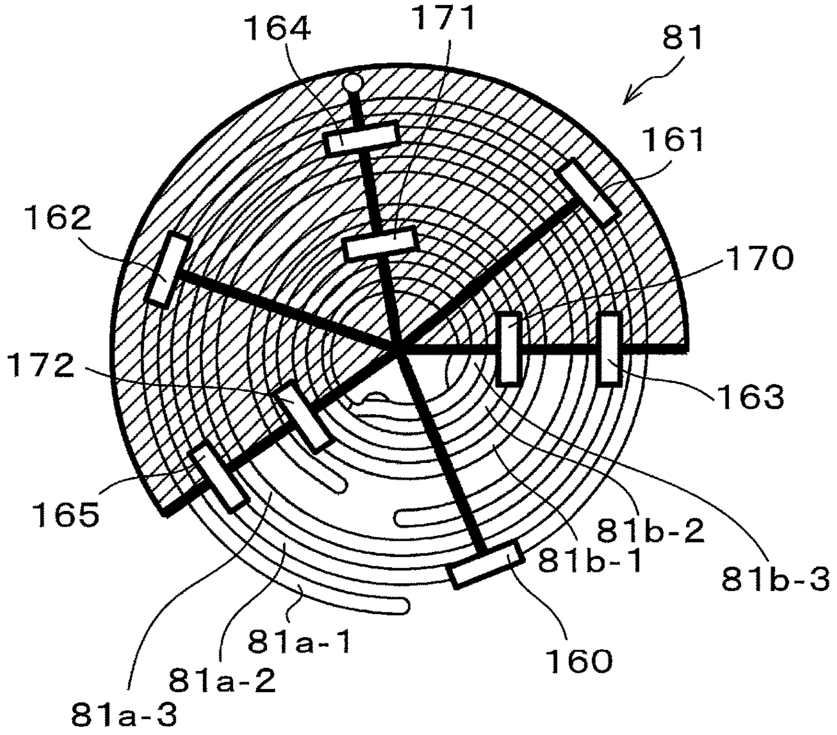
FIG. 10 is a schematic explanatory view illustrating a first example of a configuration in which a plurality of clamp-like members is arranged in the coil holder.
Figure 11:
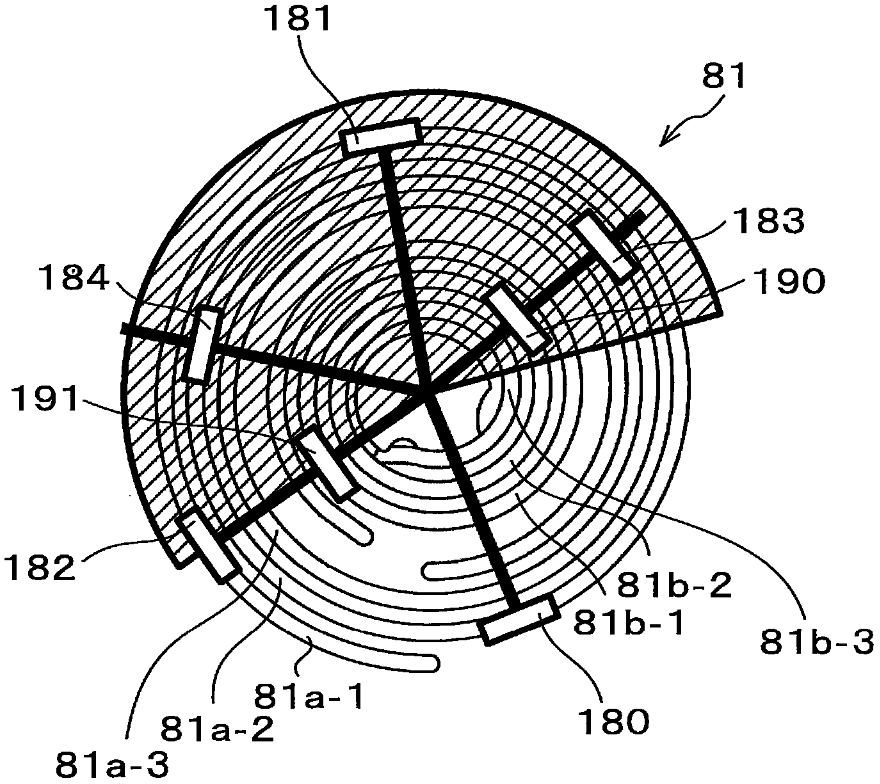
FIG. 11 is a schematic explanatory view illustrating a second example of the configuration in which the plurality of clamp-like members is arranged in the coil holder.

FIG. 10 is a schematic explanatory view illustrating a first example of an arrangement configuration of a plurality of clamp-like members 125 in the coil holder 120. FIG. 11 is a schematic explanatory view illustrating a second example of the arrangement configuration of the plurality of clamp-like members 125 in the coil holder 120. In addition, in the following description, when illustrating the arrangement configuration of the clamp-like members 125 in a plan view, respective arrangement positions are indicated by different symbols.

As illustrated in FIG. 10, in one embodiment, the main-coil 81a has a triple circular ring-shaped structure in which a coil 81a-1, a coil 81a-2, and a coil 81a-3 are arranged in the named order from the outside. The sub-coil 81b has a triple circular ring-shaped structure in which a coil 81b-1, a coil 81b-2, and a coil 81b-3 are arranged in the named order from the outside. Further, six rod-shaped beam-like members 122 are arranged radially to protrude outward from the center.

In the configuration of FIG. 10, the clamp-like members 125 are arranged on all of the six beam-like members 122 at positions 160, 161, 162, 163, 164, and 165 where the main-coil 81a is held. The positions 160 to 162 are on the coil 81a-1, and the positions 163 to 165 are on the coil 81a-2.

Further, the clamp-like members 125 are arranged on three of the six beam-like members 122 at positions 170, 171 and 172 where the sub-coil 81b is held. The positions 170 to 172 are all on the coil 81b-2.

Further, as illustrated in FIG. 11, in one embodiment, the main-coil 81a has a triple circular ring-shaped structure in which the coil 81a-1, the coil 81a-2, and the coil 81a-3 are arranged in the named order from the outside. The sub-coil 81b has a triple circular ring-shaped structure in which the coil 81b-1, the coil 81b-2, and the coil 81b-3 are arranged in the named order from the outside. Further, five rod-shaped beam-like members 122 are arranged radially to protrude outward from the center.

In the configuration of FIG. 11, the clamp-like members 125 are arranged on all of the five beam-like members 122 at positions 180, 181, 182, 183, and 184 where the main-coil 81a is held. The positions 180 to 182 are on the coil 81a-1, and the positions 183 and 184 are on the coil 81a-2.

Further, the clamp-like members 125 are arranged on two of the five beam-like members 122 at positions 190 and 191 where the sub-coil 81b is held. The positions 190 and 191 are on the coil 81b-2.

As illustrated in FIGS. 10 and 11, the clamp-like members 125 are attached to each of the plurality of beam-like members 122 at at least one or more places. Further, the clamp-like members 125 are arranged on at least one or more places of the main-coil 81a, and are also arranged on at least one or more places of the sub-coil 81b. With this configuration, both the main-coil 81a and the sub-coil 81b are held by the coil holder 120 in a reliable manner.

Further, even in either configurations of FIGS. 10 and 11, the creeping distance between the clamp-like members 125 may be set as long as possible. The creeping distance tends to be longer when there are fewer clamp-like members 125. Accordingly, the configuration of FIG. 11 is preferable compared to the configuration of FIG. 10.

In addition, the arrangement configuration of the clamp-like members 125 in the coil holder 120 is optional and is not limited to the configurations described with reference to FIGS. 10 and 11. That is, other configurations may be employed as long as the clamp-like members 125 are arranged on at least one or more places of the main-coil 81a and are also arranged on at least one or more places of the sub-coil 81b and as long as the creeping distance between the respective clamp-like members 125 is set to be 10 mm or more.

<Plasma Processing Method>

The vacuum processing system 1 and the plasma processing apparatus 32 according to the present embodiment are configured as described above. Next, the plasma processing of the substrate W performed using the plasma processing apparatus 32 will be described.

To perform the plasma processing of the substrate W, first, the substrate W to be processed is placed on the stage 90 in the processing space S. Specifically, the substrate W to be processed is picked up from the FOUP “F”, which is placed on the load port 11, by a wafer transfer mechanism (not illustrated). The horizontal orientation of the substrate W is adjusted in the aligner module 13, and subsequently, the substrate W is loaded into the plasma processing apparatus 32 via the load lock module 20 and the wafer transfer mechanism 40 and is placed on the stage 90.

During the plasma processing on the substrate W, plasma generated in the plasma generation space P is supplied to the processing space S via the partition plate 61. Here, since the partition plate 61 has the labyrinth structure as described above, only radicals generated in the plasma generation space P are transmitted to the processing space S. Then, the radicals supplied to the processing space S act on the substrate W placed on the stage 90 so that the plasma processing is performed on the substrate W.

Here, during the plasma processing on the substrate W, the plasma generator 80, which uses the RF antenna 81 as a plasma excitation antenna, is operated. At that time, a high voltage is applied to the main-coil 81a and the sub-coil 81b which constitute the RF antenna 81 so that thermal expansion and contraction occur in the main-coil 81a and the sub-coil 81b. Here, the main-coil 81a and the sub-coil 81b are held by the clamp-like members 125 of the coil holder 120.

As described above, the clamp-like members 125 are configured to be movable in the coil diameter direction. Thus, even if the main-coil 81a and the sub-coil 81b undergo the thermal expansion and contraction, the clamp-like members 125 operate to follow the thermal expansion and contraction. This prevents the main-coil 81a and the sub-coil 81b and the coil holder 120 (particularly, the clamp-like members 125) from rubbing. Further, the generation of dust due to the rubbing is suppressed, which prevents abnormal discharge caused by discharge due to the dust.

After that, when a desired processing result is obtained for the substrate W, the plasma processing in the plasma processing apparatus 32 ends. To end the plasma processing, the supply of the radio-frequency power to the RF antenna 81 and the supply of the processing gas from the gas supplier 70 are stopped. Further, the exhauster 100 is operated to exhaust the processing gas remaining in the processing space S.

Subsequently, the substrate W subjected to the plasma processing is delivered from above the stage 90 to the wafer transfer mechanism 40 and is unloaded from the processing container 60. The substrate W unloaded from the processing container 60 is transferred to the load lock module 20 by the wafer transfer mechanism 40, and subsequently, is cooled down in the cooling storage 12 and accommodated in the FOUP "F" placed on the load port 11. Then, once the desired plasma processing is terminated for all the substrates W accommodated in the FOUP "F" and the lastly-processed substrate W is accommodated in the FOUP "F", a series of wafer processing in the vacuum processing system 1 ends.

TECHNICAL ACTION EFFECTS OF PRESENT DISCLOSURE

As described above, according to the plasma processing apparatus 32 including the coil holder 120 of the present embodiment, even when the thermal expansion or contraction occurs in the main-coil 81*a* or the sub-coil 81*b* which constitutes the RF antenna 81, the main-coil 81*a* or the sub-coil 81*b* and the coil holder 120 are prevented from rubbing against each other. That is, since the clamp-like member 125 attached to the coil holder 120 has a pendulum structure and is configured to operate following the thermal expansion and contraction of the main-coil 81*a* and the sub-coil 81*b* while holding the main-coil 81*a* and the sub-coil 81*b*, the main-coil 81*a* or the sub-coil 81*b* and the coil holder 120 are prevented from rubbing against each other. This prevents the generation of the abnormal discharge, which is caused by discharge resulting from the dust generated by rubbing the RF antenna 81 and the coil holder 120 against each other.

Further, the clamp-like members 125 in the coil holder 120 hold the main-coil 81*a* at at least one or more places of the main-coil 81*a* and also hold the sub-coil 81*b* at at least one or more places of the sub-coil 81*b*. The creeping distance between the clamp-like members 125 at that time is set to a predetermined value or more. This prevents the generation of the abnormal discharge caused by the creeping discharge.

The embodiments disclosed herein should be considered to be exemplary and not limitative in all respects. The above embodiments may be omitted, replaced, or modified in various forms without departing from the scope of the appended claims, configuration examples within the technical scope of the present disclosure, and the gist thereof. For example, the constituent elements of the above embodiments may be arbitrarily combined. From this arbitrary combination, actions and effects related to each element of the combination are naturally obtained, and other actions and effects that are clear to those skilled in the art from the description in this specification are obtained.

Further, the effects described herein are merely illustrative or exemplary and not limiting. In other words, the technology of the present disclosure may produce other effects that are clear to those skilled in the art from the description of this specification in addition to or instead of the above effects.

In addition, the following configuration examples also belong to the technical scope of the present disclosure.

(1) A plasma processing apparatus includes: a processing container; a stage arranged inside the processing container and configured to place a substrate to be processed on the stage; a plasma excitation antenna arranged above the processing container; a coil holder configured to hold the plasma excitation antenna; and a radio-frequency power supply configured to supply radio-frequency power to the plasma excitation antenna, wherein the coil holder includes a plurality of beam-like members arranged radially to protrude outward from a center of the coil holder, and a clamp-like member attached to each of the plurality of beam-like members and suspended downward from each of the plurality of beam-like members. The clamp-like member has an upper end supported by each of the plurality of beam-like members with a screw member and is configured to move in a pendulum manner, and a gripper configured to grip and hold the plasma excitation antenna is formed in a lower end of the clamp-like member.

(2) In the plasma processing apparatus of (1) above, the plasma excitation antenna is an antenna assembly including a main-coil and a sub-coil, an outer shape of each of the main-coil and the sub-coil is formed in a substantially circular spiral shape in a plan view, the main-coil and the sub-coil are arranged such that the outer shapes of the main-coil and the sub-coil are in a concentric relationship with each other, and the sub-coil is provided radially inward of the main-coil.

(3) In the plasma processing apparatus of (1) or (2) above, the gripper includes gripping members that are paired at left and right sides, and the gripping members hold a conductor constituting the main-coil and the sub-coil by gripping the conductor from the left and right sides.

(4) In the plasma processing apparatus of any one of (1) to (3) above, a gap is formed in a height direction between a lid of the processing container and both the plasma excitation antenna and the coil holder, and the gap is designed to be 2 mm or more.

(5) In the plasma processing apparatus of (2) above, the clamp-like member includes at least one or more clamp-like members attached to each of the plurality of beam-like members, and the at least one or more clamp-like members hold the main-coil at at least one or more places of the main-coil and hold the sub-coil at at least one or more places of the sub-coil.

(6) In the plasma processing apparatus of (5) above, the at least one or more clamp-like members are arranged at positions to hold the main-coil on all of the plurality of beam-like members, and are arranged at positions to hold the sub-coil on some of the plurality of beam-like members.

(7) In the plasma processing apparatus of any one of (1) to (6) above, the coil holder is formed of polyimide.

(8) In the plasma processing apparatus of any one of (1) to (7) above, the clamp-like member is set to be arranged based on a creeping distance.

According to the present disclosure, it is possible to properly prevent an abnormal discharge in an RF circuit from occurring during a plasma processing.

While certain embodiments have been described, these embodiments have been presented by way of example only, and are not intended to limit the scope of the disclosures. Indeed, the embodiments described herein may be embodied in a variety of other forms. Further, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A plasma processing apparatus comprising:

a processing container;

a stage arranged inside the processing container and configured to place a substrate to be processed on the stage;

a plasma excitation antenna arranged above the processing container;

a coil holder configured to hold the plasma excitation antenna; and a radio-frequency power supply configured to supply radio-frequency power to the plasma excitation antenna, wherein the coil holder includes a plurality of beam-like members arranged radially to protrude outward from a center of the coil holder, and a clamp-like member attached to each of the plurality of beam-like members and suspended downward from each of the plurality of beam-like members, wherein the clamp-like member has an upper end supported on each of the plurality of beam-like members in a pendulum manner by a screw member, and is configured to move in a longitudinal direction of each of the plurality of beam-like members with the screw member as an axis, and wherein a gripper configured to grip and hold the plasma excitation antenna is formed in a lower end of the clamp-like member.

2. The plasma processing apparatus of claim 1, wherein the plasma excitation antenna is an antenna assembly including a main-coil and a sub-coil, wherein an outer shape of each of the main-coil and the sub-coil is formed in a substantially circular spiral shape in a plan view, wherein the main-coil and the sub-coil are arranged such that the outer shapes of the main-coil and the sub-coil are in a concentric relationship with each other, and wherein the sub-coil is provided radially inward of the main-coil.

3. The plasma processing apparatus of claim 2, wherein the gripper includes gripping members that are paired at left and right sides, and wherein the gripping members hold a conductor constituting the main-coil and the sub-coil by gripping the conductor from the left and right sides.

4. The plasma processing apparatus of claim 2, wherein a gap is formed in a height direction between a lid of the processing container and both the plasma excitation antenna and the coil holder, and wherein the gap is designed to be 2 mm or more.

5. The plasma processing apparatus of claim 2, wherein the clamp-like member includes at least one or more clamp-like members attached to each of the plurality of beam-like members, and wherein the at least one or more clamp-like members hold the main coil at at least one or more places of the main-coil and hold the sub-coil at at least one or more places of the sub-coil.

6. The plasma processing apparatus of claim 5, wherein the at least one or more clamp-like members are arranged at positions to hold the main-coil on all of the plurality of beam-like members, and are arranged at positions to hold the sub-coil on some of the plurality of beam-like members.

7. The plasma processing apparatus of claim 2, wherein the coil holder is formed of polyimide.

8. The plasma processing apparatus of claim 2, wherein the clamp-like member is set to be arranged based on a creeping distance.

9. The plasma processing apparatus of claim 1, wherein a gap is formed in a height direction between a lid of the processing container and both the plasma excitation antenna and the coil holder, and wherein the gap is designed to be 2 mm or more.

10. The plasma processing apparatus of claim 1, wherein the coil holder is formed of polyimide.

11. The plasma processing apparatus of claim 1, wherein the clamp-like member is set to be arranged based on a creeping distance.

12. A coil holder that holds a plasma excitation antenna used in a plasma processing apparatus, the coil holder comprising:

a plurality of beam-like members arranged radially to protrude outward from a center of the coil holder; and a clamp-like member attached to each of the plurality of beam-like members and suspended downward from each of the plurality of beam-like members, wherein the clamp-like member has an upper end supported on each of the plurality of beam-like members in a pendulum manner by a screw member, and is configured to move in a longitudinal direction of each of the plurality of beam-like members with the screw member as an axis, and wherein a gripper configured to grip and hold the plasma excitation antenna is formed in a lower end of the clamp-like member.

* * * * *